United States Patent
DeBiccari et al.

(10) Patent No.: US 12,216,184 B2
(45) Date of Patent: *Feb. 4, 2025

(54) AUTOMATED INSPECTION FOR INTERNAL CORROSION

(71) Applicant: Raytheon Technologies Corporation, Farmington, CT (US)

(72) Inventors: Andrew DeBiccari, Hartford, CT (US); Zhong Ouyang, Glastonbury, CT (US)

(73) Assignee: RTX Corporation, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/310,937

(22) Filed: May 2, 2023

(65) Prior Publication Data

US 2023/0273277 A1    Aug. 31, 2023

Related U.S. Application Data (63) Continuation of application No. 16/948,029, filed on Aug. 27, 2020, now Pat. No. 11,668,773, which is a
(Continued)

(51) Int. Cl.
*G01R 33/12* (2006.01)
*G01M 15/14* (2006.01)
*G01N 27/87* (2006.01)

(52) U.S. Cl.
CPC ......... *G01R 33/1223* (2013.01); *G01M 15/14* (2013.01); *G01N 27/87* (2013.01)

(58) Field of Classification Search
CPC ............................ G01R 33/1223; G01N 27/87
See application file for complete search history.

(56) References Cited

U.S. PATENT DOCUMENTS

| 4,755,753 A | 7/1988 | Chern |
| 6,198,280 B1 | 3/2001 | Hensley et al. |

(Continued)

FOREIGN PATENT DOCUMENTS

| DE | 102004030501 A1 | 1/2006 |
| EP | 1659399 A2 | 5/2006 |

(Continued)

OTHER PUBLICATIONS

Extended European Search Report dated Jan. 26, 2022, received for corresponding European Application No. 21192411.3, pp. 8.

(Continued)

*Primary Examiner* — Reena Aurora
(74) *Attorney, Agent, or Firm* — Kinney & Lange, P.A.

(57) ABSTRACT

A system for magnetically inspecting a metallic component uses a manipulator configured to manipulate a relative position between a part fixture that holds the metallic component and a probe fixture that holds a magnetic probe, thereby causing the probe tip to trace an inspection route along the surface of the metallic component so that the probe tip contacts the metallic component such that an angular difference between the probe axis and a vector normal to the surface is less than a predetermined angle delta. The magnetic probe has a probe tip that measures magnetic permeability of the metallic component along the inspection route, which the controller receives. A method of performing the magnetic inspection is also disclosed.

18 Claims, 9 Drawing Sheets

Related U.S. Application Data continuation-in-part of application No. 16/361,303, filed on Mar. 22, 2019, now Pat. No. 11,002,638.

(56) References Cited

U.S. PATENT DOCUMENTS

| | | | |
|---|---|---|---|
| 7,925,454 B1 | 4/2011 | Narcus | |
| 8,742,944 B2 * | 6/2014 | Mitchell | G01K 1/024 340/870.16 |
| 11,668,773 B2 * | 6/2023 | DeBiccari | G01N 27/87 324/228 |
| 2004/0004475 A1 | 1/2004 | Goldfine et al. | |
| 2010/0207619 A1 | 8/2010 | Wu et al. | |
| 2015/0160164 A1 | 6/2015 | Plotnikov et al. | |

FOREIGN PATENT DOCUMENTS

| | | |
|---|---|---|
| FR | 2922472 B1 | 4/2009 |
| JP | 63132108 A | 6/1988 |

OTHER PUBLICATIONS

Communication Pursuant to Article 94(3) EPC, dated Feb. 27, 2024, 13 pages.

* cited by examiner

AUTOMATED INSPECTION FOR INTERNAL CORROSION

CROSS-REFERENCE TO RELATED APPLICATION(S)

This application is a continuation application of U.S. patent application Ser. No. 16/948,029, entitled "AUTOMATED INSPECTION FOR INTERNAL CORROSION", filed Aug. 27, 2020, which is incorporated by reference herein in its entirety. U.S. patent application Ser. No. 16/948,029 is a continuation in part of U.S. patent application Ser. No. 16/361,303, entitled "MULTI-ZONE AUTOMATIC MAGNETOSCOP INSPECTION SYSTEM", filed Mar. 22, 2019, which is incorporated by reference herein in its entirety.

BACKGROUND

The present disclosure relates generally to gas turbine engines, and more particularly, to the inspection of gas turbine engine components for internal corrosion.

A gas turbine engine typically includes a high pressure spool, a combustion system and a low pressure spool disposed within an engine case to form a generally axial, serial flow path about the engine centerline. The high pressure spool includes a high pressure turbine, a high pressure shaft extending axially forward from the high pressure turbine, and a high pressure compressor connected to a forward end of the high pressure shaft. The low pressure spool includes a low pressure turbine, which is disposed downstream of the high pressure turbine, a low pressure shaft, which typically extends coaxially through the high pressure shaft, and a low pressure compressor connected to a forward end of the low pressure shaft, forward of the high pressure compressor. The combustion system is disposed between the high pressure compressor and the high pressure turbine and receives compressed air from the compressors and fuel provided by a fuel injection system. A combustion process is carried out within the combustion system to produce high energy gases to produce thrust and turn the high and low pressure turbines, which drive the compressors to sustain the combustion process.

Gas turbine engines used in certain applications, such as helicopters and industrial power generation, include a third spool that is a power spool. The power spool includes a power turbine, which is disposed downstream of the low pressure turbine, and a power shaft, which typically extends forward coaxially through the high and low pressure shafts. The power shaft provides torque that can turn, for example, a rotor or a generator. The high and low pressure spools as well as the power spool include alternating cascades of stators and rotors in order to work on the primary fluid in the flow path. Gas turbine engines typically include a variety of internal components or airfoil components such as, for example, turbine blades and turbine vanes. The turbine blades and vanes are typically made of a metal or metal alloy and can include internal cooling passages which are exposed to hot temperature environments that can contain oxygen and water vapor. Exposure to these environmental conditions can lead to corrosion of the internal walls of the cooling passages over time. This internal passage corrosion can decrease the thickness of non-corroded wall portions, which can reduce the overall integrity of blades and/or vanes. Accordingly, an inspection of these gas turbine engine components is typically performed at different times during the service life of a gas turbine engine to verify the integrity of these components, and/or to indicate the need for repair or replacement of affected components.

A known means of inspecting the internal passages of a metallic gas turbine engine component for internal corrosion is to use a magnetic probe that detects the magnetic permeability of the component, thereby giving an indication of the amount of internal corrosion. From this, and knowing the original wall thickness of the component, the remaining unaffected wall thickness can be calculated. In a known inspection process, a human operator glides the magnetic probe by hand over the surface of the component while observing and/or recording a signal that is produced by the magnetic probe. Greater accuracy is generally obtained by holding the magnetic probe perpendicular to the surface of the component while moving it at a steady linear speed over the surface. Accordingly, considerable training and experience can be required of an operator to develop a high level of proficiency in holding and moving the magnetic probe. Moreover, a modern gas turbine engine component can have a complex internal geometry that requires the magnetic probe be positioned with care, assuring that the magnetic probe is moved over underlying hollow areas of the component. A template can be positioned over the surface of the component, directing the operator to move the magnetic probe in a particular path over the component to help assure that the underlying hollow area of the component is inspection. A sleeve that slips over the component is an example of a template. The time that an operator must spend performing an inspection on a gas turbine engine component having a complex internal geometry directly contributes to the cost of performing the inspection. Moreover, an operator typically requires training and practice to perform the described inspection proficiently. Accordingly, there is a need for an automated means of using a magnetic probe to perform an inspection of a gas turbine engine component.

SUMMARY

A system for magnetically inspecting a metallic component having a surface includes a part fixture configured to hold the metallic component in a first position, a probe fixture configured to hold a magnetic probe in a second position, a manipulator configured to manipulate a relative position between the first position and the second position, and a controller configured to cause the manipulator to manipulate the relative position so as to cause the probe tip to trace an inspection route along the surface of the metallic component whereby the probe tip contacts the metallic component such that an angular difference between the probe axis and a vector normal to the surface is less than a predetermined angle delta. The magnetic probe has a probe tip aligned with a probe axis and is configured to measure a magnetic permeability of the metallic component. The controller receives the magnetic permeability of the metallic component measured by the magnetic probe along the inspection route.

A method of using a system having a part fixture configured to hold a metallic component in a first position, a probe fixture configured to hold a magnetic probe having a probe tip aligned with a probe axis and configured to measure a magnetic permeability of the metallic component in a second position, a manipulator configured to manipulate a relative position between the first position and the second position, and a controller to inspect a metallic component having a surface. The method includes the steps of calculating, by the controller, an inspection route over at least a portion of the surface based at least in part on a three-dimensional model of the metallic component; generating, by the controller, a control signal that causes the manipulator to manipulate the relative position so as to cause the probe tip to trace an inspection route upon the surface of the metallic component along which the probe tip contacts the metallic component such that an angular difference between the probe axis and a vector normal to the surface is less than a predetermined angle delta; and receiving, by the controller, the magnetic permeability of the metallic component measured by the magnetic probe along the inspection route.

DETAILED DESCRIPTION

Turbine blades and vanes used in gas turbine engines typically include various metallic materials that can be susceptible to corrosion under some conditions. Nickel (Ni) is an exemplary metal that is used in a metal alloy used to make turbine blades and vanes. The internal corrosion of turbine blades and/or vanes can cause depletion of pure nickel (Ni) from a base metal alloy, which in turn can cause deposition of corrosion byproducts on the internal wall(s) of the corroding component. Nickel oxide (NiO) and cobalt oxide (CoO) are exemplary corrosion byproducts. These corrosion byproducts can have ferromagnetic properties that can be sensed by a magnetic probe that measures the magnetic permeability and/or a change in magnetic permeability. A MAGNETOSCOP™ (also known as "Magnetoscop") is an exemplary magnetic inspection probe that can be used to provide an indication on the magnetic permeability of an adjacent material, thereby giving an indication of corrosion byproducts. This in turn gives an indication of the amount of corrosion in a gas turbine blade or vane in an interior region adjacent to the magnetic inspection probe. For example, magnetic inspection probes (also known as magnetometers, magnetic probes, and magnetoscopes) are capable of generating a magnetic flux density and measuring a relative magnetic permeability (i.e., permeability) of a wide array of metal alloys, including low-permeable (non-magnetic) alloys. Magnetic inspection probes can also detect changes in a material (e.g., sulfidation, degradation of lamination, structural changes) based on comparative magnetic permeability measurements (i.e., magnetic field anomalies). Gas turbine engine components having hollow geometries (e.g., internal cooling passages) can complicate the use of a magnetic inspection probe (e.g., MAGNETOSCOP™), and it can be necessary to know the underlying internal structure of a component when operating a magnetic inspection probe on the exterior (i.e., external) surface.

Figure 1:
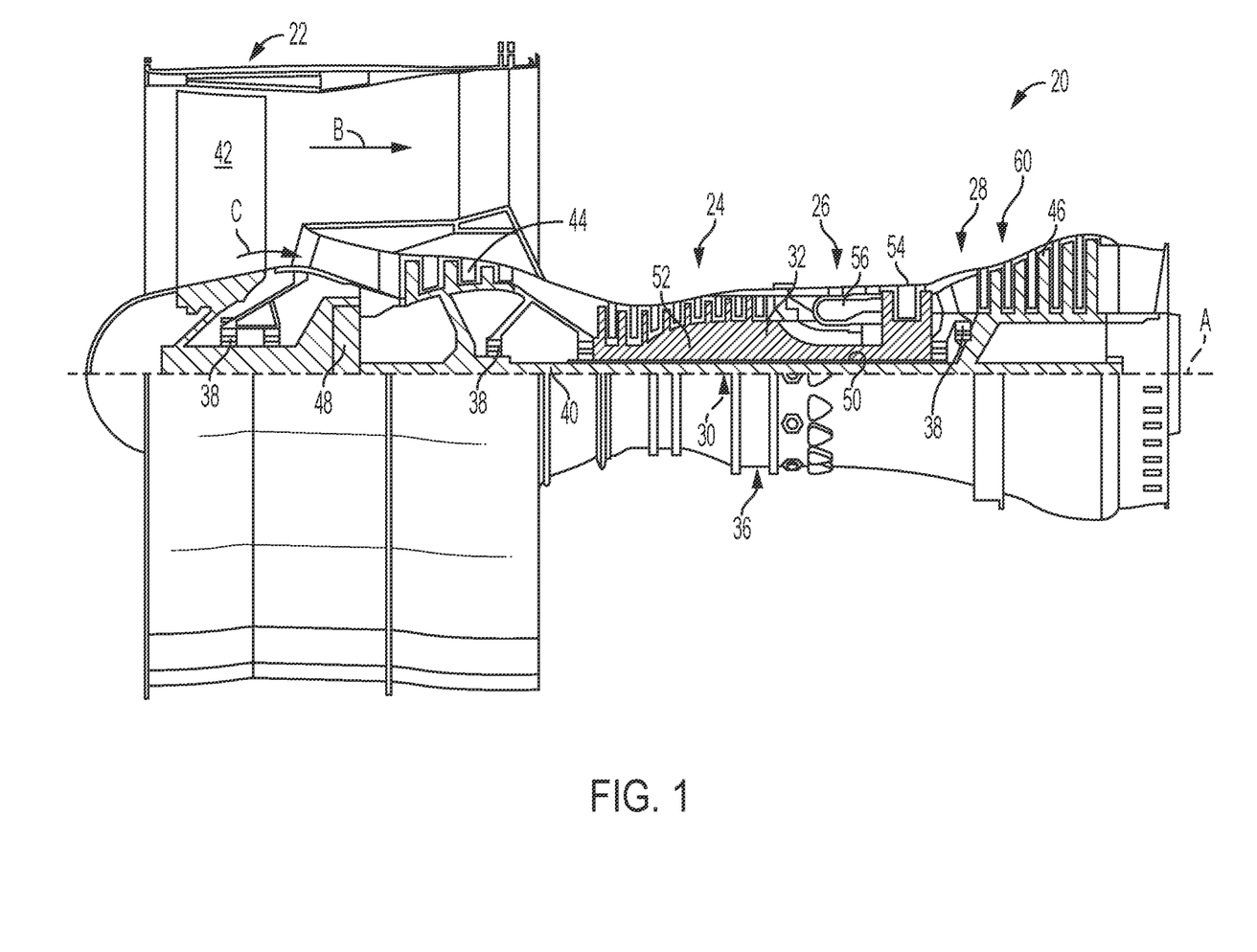
FIG. 1 is a partial cross-sectional view of a gas turbine engine.

FIG. 1 is a partial cross-sectional view of a gas turbine engine. Gas turbine engine 20 is an exemplary non-limiting embodiment of the present disclosure. Gas turbine engine 20 is a two-spool turbofan that generally incorporates fan section 22, compressor section 24, combustor section 26, and turbine section 28. In other embodiments, gas turbine engine 20 can include other systems or features. Fan section 22 drives air along a bypass flow path B in a bypass duct, while compressor section 24 drives air along a core flow path C for compression and communication into combustor section 26 and then expansion through turbine section 28. Although depicted as a two-spool turbofan gas turbine engine in the illustrated embodiment, it should be understood that the concepts described herein are not limited to use with two-spool turbofans as these teachings may be applied to other types of turbine engines including three-spool architectures.

Gas turbine engine 20 includes low speed spool 30 and high speed spool 32 mounted for rotation about central longitudinal axis A relative to engine static structure 36 via several bearing systems 38. Various bearing systems 38 at various locations may alternatively and/or additionally be provided, and the location of bearing systems 38 may be varied as appropriate to any particular embodiment.

Low speed spool 30 generally includes inner shaft 40 that interconnects fan 42, low pressure compressor 44, and low pressure turbine 46. In the illustrated embodiment, inner shaft 40 is connected to fan 42 through geared architecture 48 (i.e., a speed change mechanism) to drive fan 42 at a lower speed than low speed spool 30. High speed spool 32 includes outer shaft 50 that interconnects high pressure compressor 52 and high pressure turbine 54. Combustor 56 is arranged in exemplary gas turbine 20 between high pressure compressor 52 and high pressure turbine 54. Engine static structure 36 supports bearing systems 38 in turbine section 28. Inner shaft 40 and outer shaft 50 are concentric and rotate via bearing systems 38 about central longitudinal axis A which is collinear with their respective longitudinal axes.

The core airflow is compressed by low pressure compressor 44 then by high pressure compressor 52, mixed and burned with fuel in combustor 56, then expanded over high pressure turbine 54 and low pressure turbine 46. High pressure turbine 54 and low pressure turbine 46 rotationally drive low speed spool 30 and high speed spool 32, respectively, as a result of the aforementioned expansion. In other embodiments, the positions of fan section 22, compressor section 24, combustor section 26, turbine section 28, and fan drive gear system 48 may be varied. In some embodiments, gear system 48 can be located aft of combustor section 26, or even aft of turbine section 28. In these or other embodiments, fan section 22 can be positioned either forward or aft of gear system 48. In any of these embodiments, gas turbine engine 20 includes a variety of internal components, including vanes and blades. Turbine blade 60 is an exemplary internal component that will be discussed in regard to the present disclosure. In an embodiment, gas turbine engine can include numerous turbine blades 60, each of which is subject to corrosion. Therefore, it is desirable to be able to inspect turbine blades 60 for internal corrosion at various times over the service life of gas turbine engine 20.

Figure 2A:
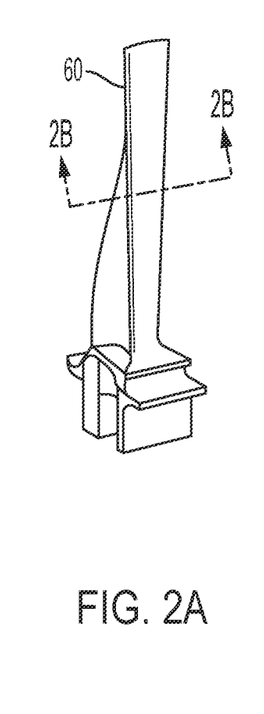
FIG. 2A is a perspective view of a turbine blade.
Figure 2B:
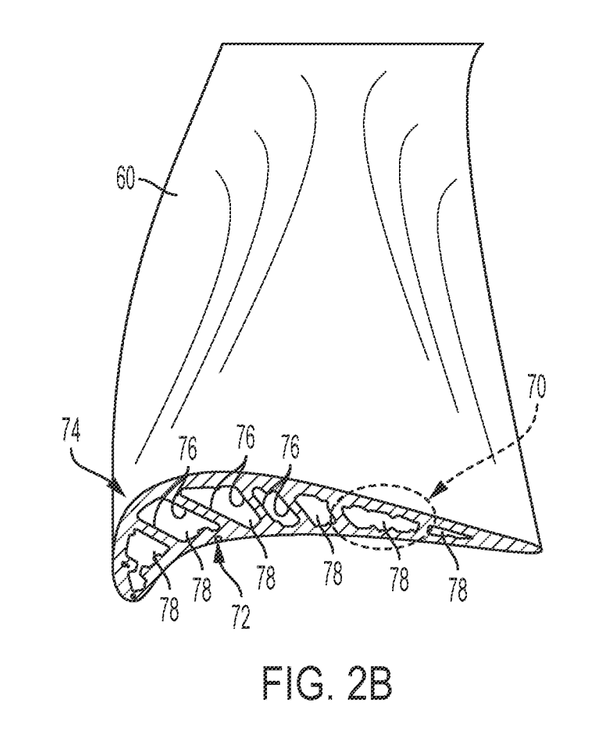
FIG. 2B is a perspective cross-sectional end view of the turbine blade shown in FIG. 2A.

FIG. 2A is a perspective view of turbine blade 60 shown in FIG. 1. FIG. 2B is a perspective cross-sectional end view of turbine blade 60 shown in FIG. 2A taken at cut line 2B-2B. Shown in FIGS. 2A-2B are interior section 70, pressure-side wall 72, suction-side wall 74, ribs 76, and cooling passages 78. Although turbine blade 60 is shown as an example, the present disclosure can be directed to the inspection of other components such as, for example, a gas turbine engine vane (not shown). Turbine blade 60 includes hollow cooling passages 78 defined by pressure-side wall 72 and suction-side wall 74. Cooling passages 78 pass cool air therethrough as pressure-side wall 72 and suction-side wall 74 are exposed to heated core gas flow. A number of ribs 76 extend between pressure-side wall 72 and suction-side wall 74 to define each individual internal cooling passage 78.

Figure 3:
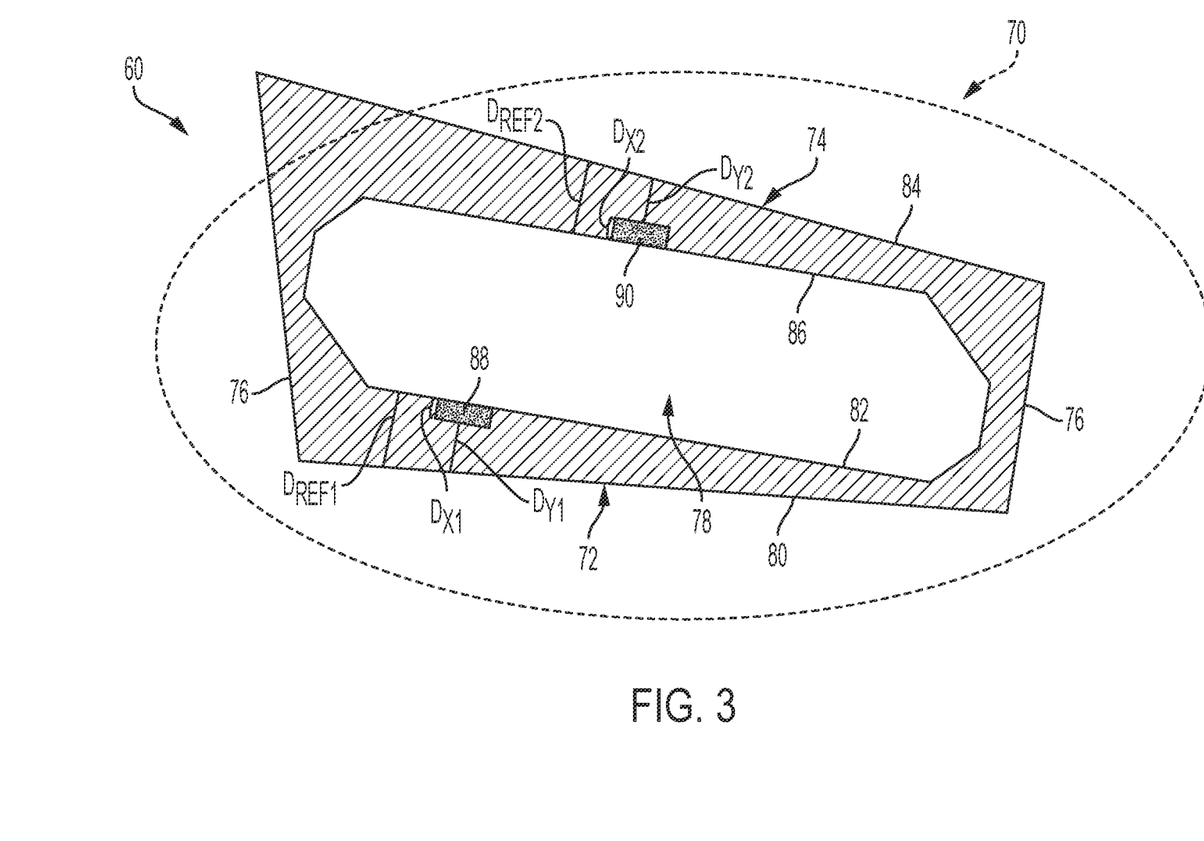
FIG. 3 is an enlarged cross-sectional end view showing a portion of the turbine blade shown in FIG. 2B.

FIG. 3 is an enlarged cross-sectional end view showing interior section 70 of turbine blade 60 shown in FIG. 2B. Shown in FIG. 3 are turbine blade 60, interior section 70, outer pressure-side wall surface 80, inner pressure-side wall surface 82, outer suction-side wall surface 84, inner suction-side wall surface 86, first corroded element 88, and second corroded element 90. Also labeled in FIG. 3 are expected first wall thickness $D_{REF1}$, expected second wall thickness $D_{REF2}$, first remaining non-corrosion wall thickness $D_{Y1}$, second remaining non-corrosion wall thickness $D_{Y2}$, first corrosion element thickness $D_{X1}$, and second corrosion element thickness $D_{X2}$. In a particular embodiment, turbine blade 60 can be inspected prior to being made available for field operation, i.e., prior to being employed in gas turbine engine 20 for first time use, thereby generating a reference profile for turbine blade 60. In an alternative embodiment, a reference profile of turbine blade 60 can be generated from a computer aided design (CAD) model of turbine blade 60. From the reference profile, expected first wall thickness $D_{REF1}$ and expected second wall thickness $D_{REF2}$ can be calculated. FIG. 3 is simplified, and in a practical embodiment, a large number of expected wall thicknesses $D_{REF1}$, $D_{REF2}$, ... $D_{REFn}$ can be established from reference profile of turbine blade 60. A magnetic inspection probe (e.g., MAGNETOSCOP™) can be used to determine first corrosion element thickness $D_{X1}$ and second corrosion element thickness $D_{X2}$, from which first remaining non-corrosion wall thickness $D_{Y1}$ and second remaining non-corrosion wall thickness $D_{Y2}$ can be calculated by subtracting corrosion element thickness $D_X$ from expected wall thickness DREF at any particular point. For example: $D_{Y1}=D_{REF1}-D_{X1}$.

Figure 4A:
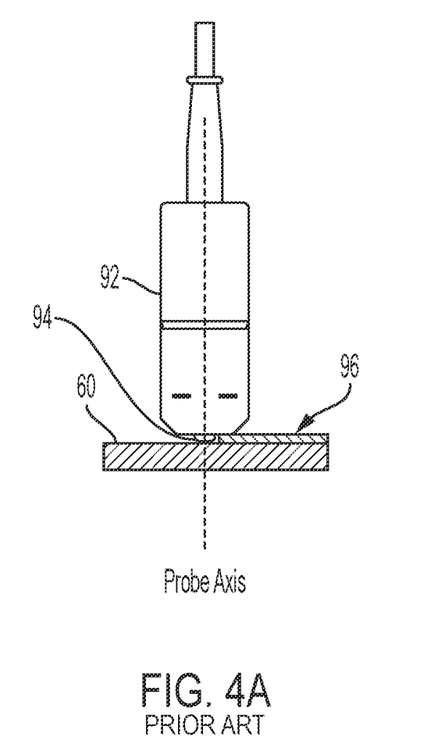
FIG. 4A is a side view showing a handheld magnetic probe of the prior art and the turbine blade shown in FIG. 2A.
Figure 4B:
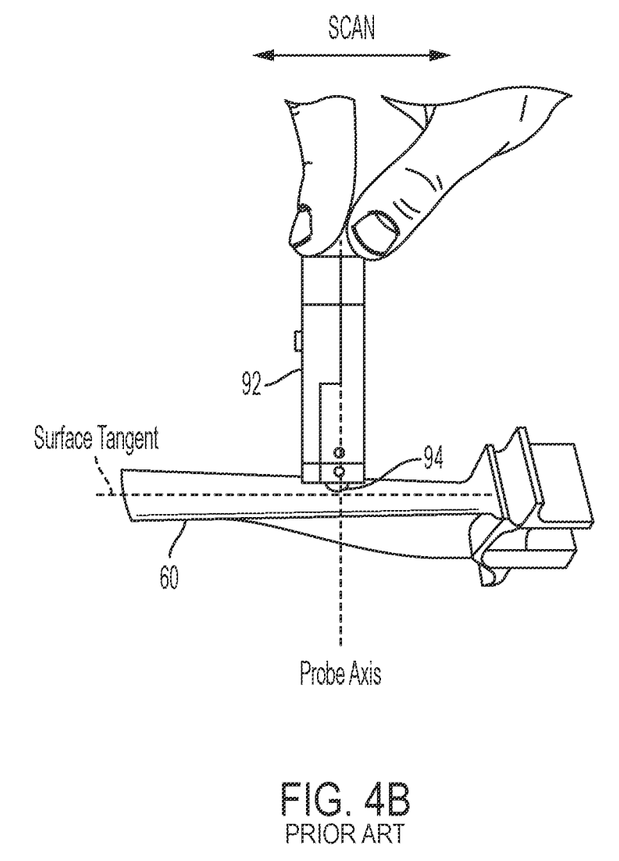
FIG. 4B is a side view showing an inspection technique using the handheld magnetic probe and the turbine blade shown in FIG. 4A.

FIG. 4A is a side view showing a handheld magnetic probe of the prior art. FIG. 4B is a side view showing an inspection technique using the handheld magnetic probe on turbine blade 60. Shown in FIGS. 4A-4B are turbine blade 60, handheld magnetic probe 92, probe tip 94, and sleeve 96. Also labeled in FIGS. 4A-4B is the probe axis. Labeled in FIG. 4B is the scan direction. In the illustrated embodiment, handheld magnetic probe 92 is a MAGNETOSCOP™, (i.e., Magnetoscop, Magnetoscop probe) that includes probe tip 94. During an inspection process, probe tip 94 is glided over an exterior surface of turbine blade 60 in either scan direction with the probe axis being perpendicular to the exterior surface while making light contact with the exterior surface. Handheld magnetic probe 92 (e.g., MAGNETOSCOP™) measures the relative magnetic permeability of the material in the vicinity of probe tip 94, being able to detect material changes caused by corrosion and the like. Because of the complex interior geometry of turbine blade 60 (e.g., as shown in FIGS. 2B and 3), sleeve 96 can be placed over turbine blade 60 to help guide the operator in positioning probe tip 94 adjacent to a cooling passage (not shown in FIG. 4A). Sleeve 96 is made of a nonmagnetic material such as plastic to not interfere with the operation of handheld magnetic probe 92. Sleeve 96 can have one or more edges or channels (not labeled in FIG. 4A) to assist an operator in guiding probe tip 94 along a desired path. An example of a desired path is along the exterior surface, following the centerline of an internal cooling passage. In some embodiments, multiple sleeves 96 can be used for a particular turbine blade 60 in order to assist an operator in inspecting all cooling passages of turbine 60. Moreover, multiple sleeves 96, each having a different configuration, may be required for a particular gas turbine engine 20 in order to provide inspection guidance for all internal components (e.g., blades and vanes). Sleeve 96 can also be referred to as an inspection template. In some embodiments of using handheld magnetic probe 92 on turbine blade 60, sleeve 96 can be omitted, thereby relying on the skill of the operator to glide probe tip 94 over the exterior surface adjacent to a cooling passage 78.

While performing a corrosion inspection of turbine blade 60 using handheld magnetic probe 92, care should be taken by the operator to hold handheld magnetic probe 92 such that the probe axis is perpendicular to the surface of turbine blade 60 at the point where probe tip 94 contacts turbine blade 60. Turbine blade 60 typically has a curved surface, thereby requiring the operator continuously adjust the orientation of handheld magnetic probe 92 to maintain the perpendicularity (i.e., normality) of the probe axis to the surface of turbine blade 60. Error can be introduced in the signal that is generated by handheld magnetic probe 92 in response to internal corrosion. During the inspection process, care should be taken by the operator to move handheld magnetic probe 92 at a steady linear speed in the scan direction, while maintaining light contact between probe tip 94 and the surface of turbine blade 60. The steady linear speed can be referred to as a target speed, or as a target scan speed. An exemplary target speed is 0.5 inch/second (1.3 cm/sec.) In some embodiments, the target speed can range from about 0.2-1 inch/second (0.5-2.5 cm/sec.) Maintaining the linear speed of probe tip 94 as steady as possible (i.e., as near the target speed as possible) will minimize the error that is introduced in the signal that is generated by handheld magnetic probe 92 in response to internal corrosion. A lower target speed can be beneficial in helping an operator maintain the probe axis perpendicular to the surface of turbine blade 60 while maintaining light contact between probe tip 94 and the surface of turbine blade 60, particularly for a less-experienced operator, but this can result in increased inspection time. The cost of performing a corrosion inspection is related to the time it takes to complete the inspection. It can be difficult for an operator to follow an inspection path marked by sleeve 96 at a higher speed while the maintaining probe axis perpendicular to the surface while also maintaining light contact between probe tip 94 and the exterior surface of turbine blade 60.

Accordingly, the skill of an operator can establish an upper limit to the target speed and accordingly, the overall time that it can take to complete an inspection. Preferably, light contact should be maintained between probe tip 94 and the exterior surface of turbine blade 60. An exemplary contact force is about 0.5 pounds force (lbf) (2.2 Nt), and a preferred (i.e., target) contact force can range from about 0.5-1 lbf (2.2-4.4 Nt.) If the contact force is too low, probe tip 94 can momentarily leave the exterior surface of turbine blade 60 while under the control of a human operator, thereby introducing error in the signal that is generated by handheld magnetic probe 92 in response to internal corrosion. It is estimated that a human operator trying to maintain a contact force less than about 0.5 lfb (2.2 Nt) can result in intermittent instances of probe tip 94 breaking surface contact, particularly at a higher linear speed. If the contact force is too great, damage to probe tip 94, probe 92, and/or sleeve 96 can occur. Moreover, maintaining a high contact force can increase the onset of fatigue in the operator who is performing the corrosion inspection, which can impede the progress of the inspection.

Figure 5:
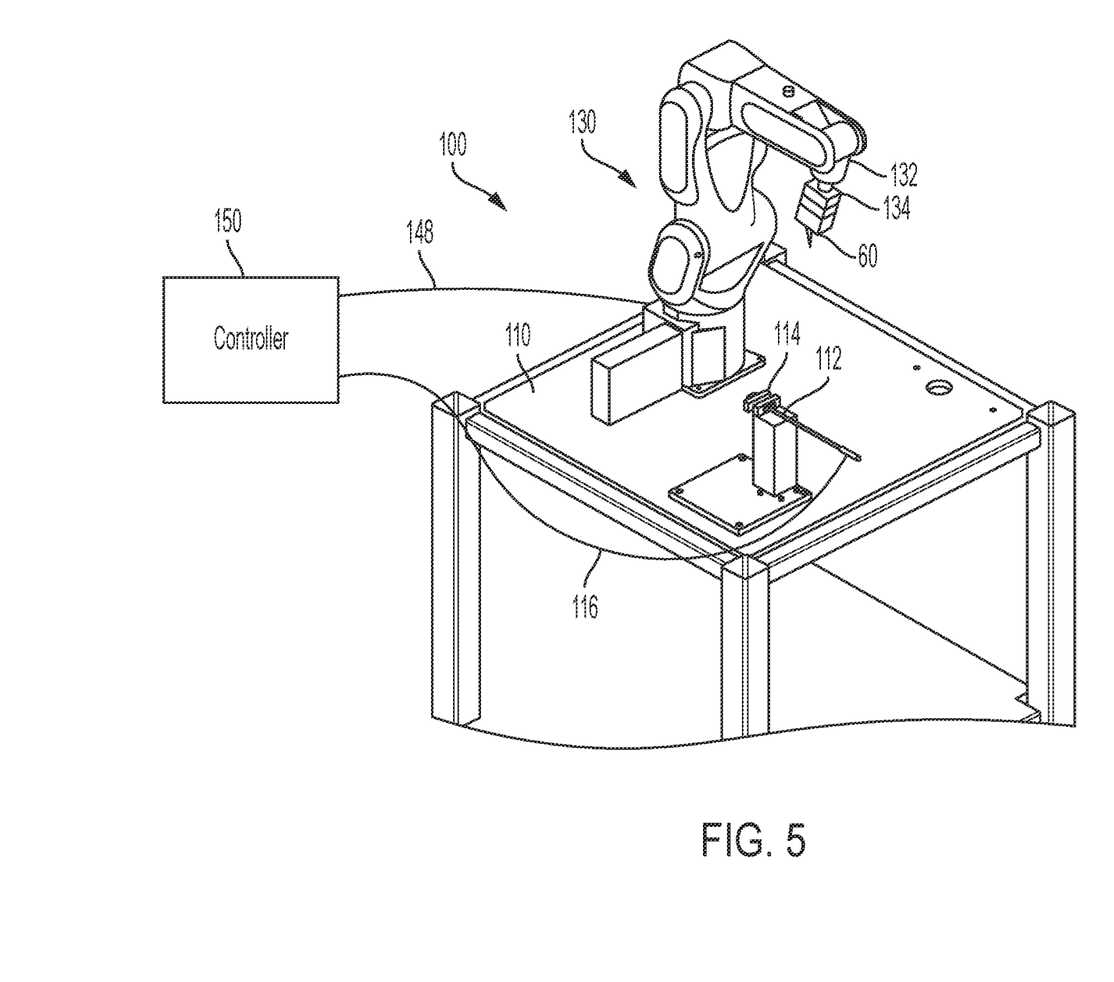
FIG. 5 is a perspective view showing an automated magnetic inspection system and the turbine blade shown in FIG. 2A.

FIG. 5 is a perspective view showing an automated magnetic inspection system and turbine blade 60. Shown in FIG. 5 are turbine blade 60, automated magnetic inspection system 100, platform 110, magnetic inspection probe 112, probe tip 114, probe cable 116, manipulator 130, actuator 132, holder 134, manipulator cable 148, and controller 150. Automated magnetic inspection system 100 includes magnetic inspection probe 112 which is fixtured to platform 110. In the illustrated embodiment, magnetic inspection probe 112 is a MAGNETOSCOP™ (i.e., Magnetoscop, Magnetoscop probe) that includes probe tip 114. Magnetic inspection probe 112 is connected to controller 150 by probe cable 116. Automated magnetic inspection system 100 also includes manipulator 130 which is attached to platform 110. Manipulator 130 can be referred to as a specialized industrial robot and includes actuator 132 which is attached to holder 134. In the illustrated embodiment, manipulator 130 is a six-axis manipulator that can position holder 134 in the x, y, and z planes as well as positioning holder using roll, pitch, and yaw movements. Manipulator 130 includes actuator 132 which helps perform six-axis positioning of holder 143. Holder 134 is configured to hold turbine blade 60 by securely gripping the blade root (not labeled) of turbine blade 60. Manipulator 130 is connected to controller 150 by manipulator cable 148, which carries power and control signals to manipulator 130 (including actuator 132).

Accordingly, in the illustrated embodiment, magnetic inspection probe 112 is held stationary while turbine blade 60 is guided over probe tip 114 to perform an automated corrosion inspection of turbine blade 60. A few advantages of this configuration (i.e., as opposed to fixing turbine blade 60 stationary while moving magnetic inspection probe 112) are that probe cable 116 is not continuously flexed during the inspection process which can result in material fatigue, and magnetic inspection probe 112 is not near actuator 132 which can introduce stray magnetic fields in the vicinity of probe tip 114, thereby contributing to error. Actuator 132 includes several electromechanical devices (i.e., motors) that can produce stray magnetic fields in their vicinity. Moreover, the stray magnetic fields can vary over the course of an inspection depending on the positioning of holder 134 (i.e., as controlled by actuator 132) throughout the inspection. In a method of the prior art as shown in FIGS. 4A-4B, an operator generally has an easier task of moving handheld magnetic probe 92 because of its relatively light weight compared to turbine blade 60. However, manipulator 130 of automated magnetic inspection system 100 can quite readily handle the weight of turbine blade 60 as shown in the exemplary embodiment. In other embodiments, automated magnetic inspection system 100 can be configured to hold turbine blade 60 stationary while moving magnetic inspection probe 112 by manipulator 130 (i.e., including by actuator 132). In an exemplary embodiment where turbine blade 60 is particularly large and/or massive (e.g., it cannot be removed from a large and/or massive component), it can be beneficial to hold turbine blade 60 stationary while moving magnetic inspection probe 112. In either configuration, automated magnetic inspection system 100 develops steady relative motion between the surface of turbine blade 60 and probe tip 114. Both configurations are included in the present disclosure.

Referring again to FIG. 5, controller 150 controls the operation of manipulator 130 to move turbine blade 60 over probe tip 114 while receiving the signal from magnetic inspection probe 112. Controller 150 includes one or more processors and computer-readable storage or memory encoded with instructions that, when executed by the one or more processors, direct turbine blade 60 over probe tip 114 such that probe tip 114 follows a path over a designated path on the exterior surface of turbine blade 60 at a steady linear speed while maintaining the probe axis (not labeled in FIG. 5) perpendicular to the exterior surface of turbine 60 at the point of contact. In the illustrated embodiment, controller 150 stores a CAD model of turbine blade 60 which is used for establishing a designated path over the exterior surface of turbine blade 60. In some embodiments, controller 150 can store a route map of the designated path over the exterior surface of turbine blade 60. In these embodiments, the route map can be preconfigured (i.e., in a process outside of controller 150) for a particular turbine blade 60 based on a CAD model of turbine blade 60. An exemplary designated path can be for probe tip 114 to follow the exterior surface aligned with an interior cooling channel. Controller 150 produces a magnetic anomaly map of turbine blade 60 based on the signal received from magnetic inspection probe 112, which is used to calculate corrosion element thickness $D_{X_n}$ and remaining non-corrosion wall thickness $D_{Y_n}$ (the descriptions of which were provided above in regard to FIG. 3). In some embodiments, controller 150 can calculate and store a corrosion map that is representative of areas of corrosion within turbine blade 60. In other embodiments, controller 150 can calculate a material remaining map that indicates the non-corroded (i.e., unaffected) regions withing turbine blade 60. In yet other embodiments, controller 150 can store a magnetic anomaly map representing magnetic anomalies along the surface of turbine blade 60. The magnetic anomalies map can be offloaded from controller 150 for processing by a system that is separate from automated magnetic inspection system 100 to analyze and calculate the corrosion inspection results of turbine blade 60. In the illustrated embodiment, manipulator 130 is a six-axis manipulator. In other embodiment, manipulator can have fewer than or greater than six axes of motion. In exemplary embodiments, manipulator 130 can have three, four, or five axes of motion. In another exemplary embodiment, manipulator 130 can have seven or more axes of motion.

Figure 6:
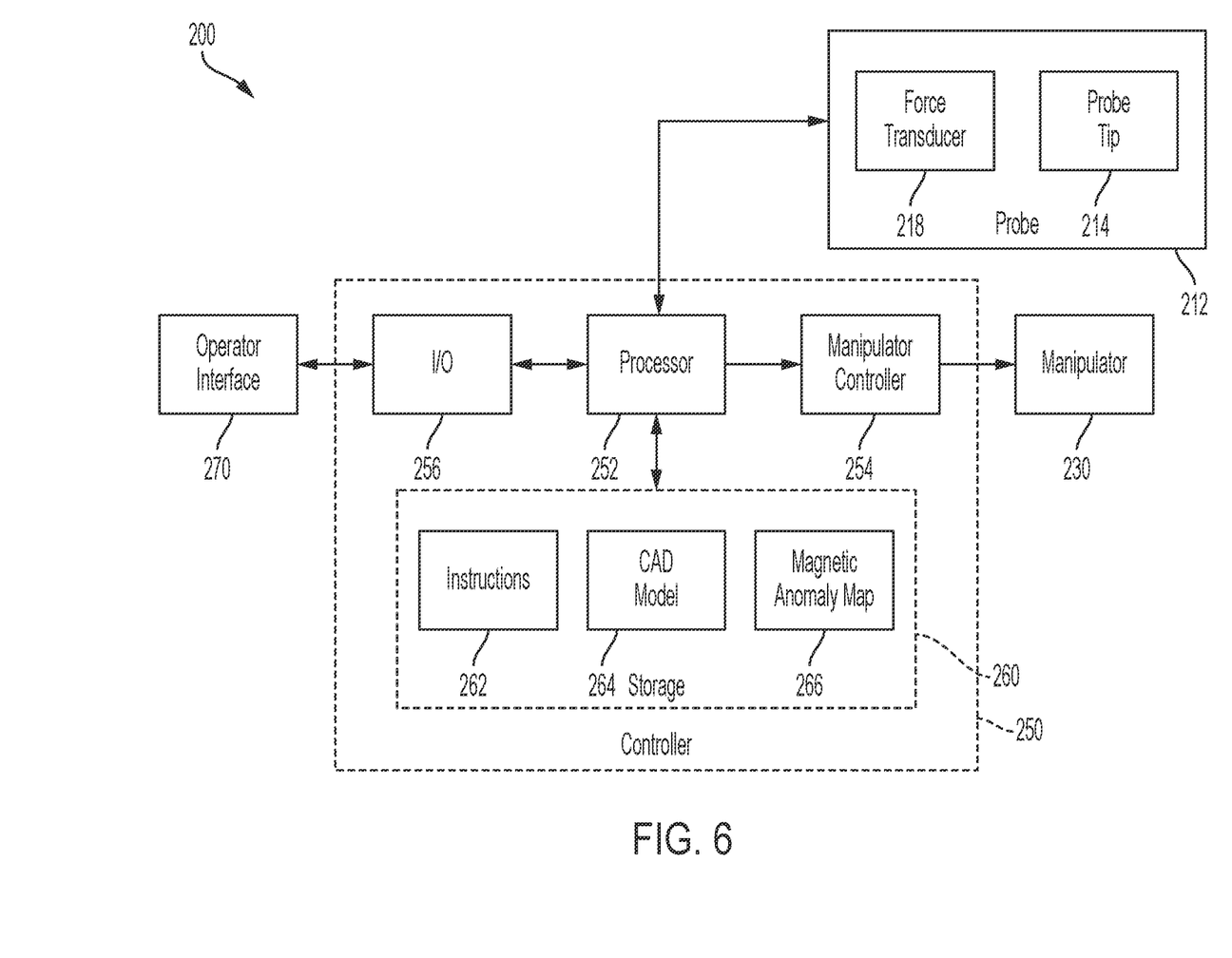
FIG. 6 is a block diagram of a second embodiment of an automated magnetic inspection system.

FIG. 6 is a block diagram of a second embodiment of an automated magnetic inspection system. Shown in FIG. 6 are automated magnetic inspection system 200, magnetic inspection probe 212, probe tip 214, force transducer 218, manipulator 230, controller 250, processor 252, manipulator controller 254, input-output (I/O) module 256, storage 260, processor instructions 262, CAD model 264, magnetic anomaly map 266, and operator interface 270. Magnetic inspection probe 212 includes probe tip 214, having a description that is substantially as provided above in regard to FIG. 5. A signal representing the magnetic permeability measurements (i.e., magnetic field anomalies) from magnetic inspection probe 212 is communicated to controller 250 via the probe cable (not labeled in FIG. 6). Magnetic inspection probe 212 also includes force transducer 218 which measures the contact force on probe tip 214 (i.e., the contact force between probe tip 214 and the exterior surface of turbine blade 60). A signal representing the probe tip contact force is generated by force transducer 218 is also communicated to controller 250 via the probe cable. The description of manipulator 230 is substantially similar to that provided above in regard to FIG. 5. Manipulator 230 includes an actuator (not shown in FIG. 6). During an inspection process, the actuator is connected to a holder (not shown in FIG. 6) which supports and manipulates turbine blade 60 in a manner as described above in regard to FIG. 5.

Controller 250 includes processor 252, actuator controller 254, I/O module 256, and storage 260. Processor 252 is connected to storage 260 and can also include internal and/or connected memory. Processor 252 Storage 260 includes processor instructions 262, CAD model 264, and magnetic anomaly map 266. Processor 252 can include one or more processors (not shown in FIG. 6) that are configured to implement functionality and/or process instructions for execution within processor 252. The one or more processors can be capable of processing instructions stored in processor instructions 262 (i.e., in storage 260). Examples of processors can include any one or more of: a microprocessor, a microcontroller, a digital signal processor (DSP), an application specific integrated circuit (ASIC), a field-programmable gate array (FPGA), or other equivalent discrete or integrated logic circuitry. In the illustrated embodiment, a three-dimensional digital model of turbine blade 60 is stored in CAD model 264 when automated magnetic inspection system 200 is inspecting turbine blade 60. As noted above in regard to FIG. 5, in some embodiments, a route map of the designated path over the exterior surface of turbine blade 60 can be stored in storage 260. As used in this disclosure, CAD model 264 refers to a model that is used by controller 250 to direct the motion of manipulator 230 relative to the surface of turbine blade 60 (i.e., regardless of whether CAD model 264 is a route map model or a three-dimensional model of turbine blade 60 from which controller 250 renders a route map). During the operation of automated magnetic inspection system 200, processor 252 executes instructions stored in processor instructions 262 to provide instructions to manipulator controller 254 which in turn communicates with manipulator 230 to position the actuator and holder (not shown in FIG. 6), thereby positioning and moving turbine blade 60 such that the exterior surface of turbine blade 60 is moved along probe tip 214 to perform an inspection. Processor 252 utilizes CAD model 264 to calculate the proper positioning and motion of manipulator 230 to perform the corrosion inspection. The positioning of turbine blade 60 will be discussed in more detail later, in FIG. 8.

Referring again to FIG. 6, as the corrosion inspection is performed during the operation of automated magnetic inspection system 200, the signal from magnetic inspection probe 212 is received by processor 252. In the illustrated embodiment, magnetic anomalies that are representative of the inspection results are stored in magnetic anomaly map 266. In an embodiment, data from magnetic anomaly map 260 can be offloaded from controller 250 for processing by a system that is separate from automated magnetic inspection system 200 to analyze and calculate the corrosion inspection results of turbine blade 60 using a map of the exterior and interior of turbine blade 60. From this, a non-corroded (i.e., unaffected material) map of turbine blade 60 can be calculated. In another embodiment, processor 252 can calculate a corrosion map or a non-corroded map based on a three-dimensional model of turbine blade 60 that is stored in CAD model 264. In any of these foregoing embodiments, data from storage 260 (e.g., magnetic anomaly map 266) can be transferred to an external system via I/O interface 256. In an exemplary embodiment, data representing the results of the corrosion inspection (i.e., inspection data) can be transferred via I/O interface after the inspection is completed. In other embodiments, inspection data can be transferred continuously or in batches during the inspection. In any of the foregoing embodiments, I/O interface 256 can be used to upload data stored in CAD model 264 to perform an inspection on a particular turbine blade 60. Examples of uploaded data include an inspection route map model, a three-dimensional exterior model, and a three-dimensional interior and exterior model. An operator supervising the corrosion inspection can control automated magnetic inspection system 200 via operator interface 270.

Figure 7:
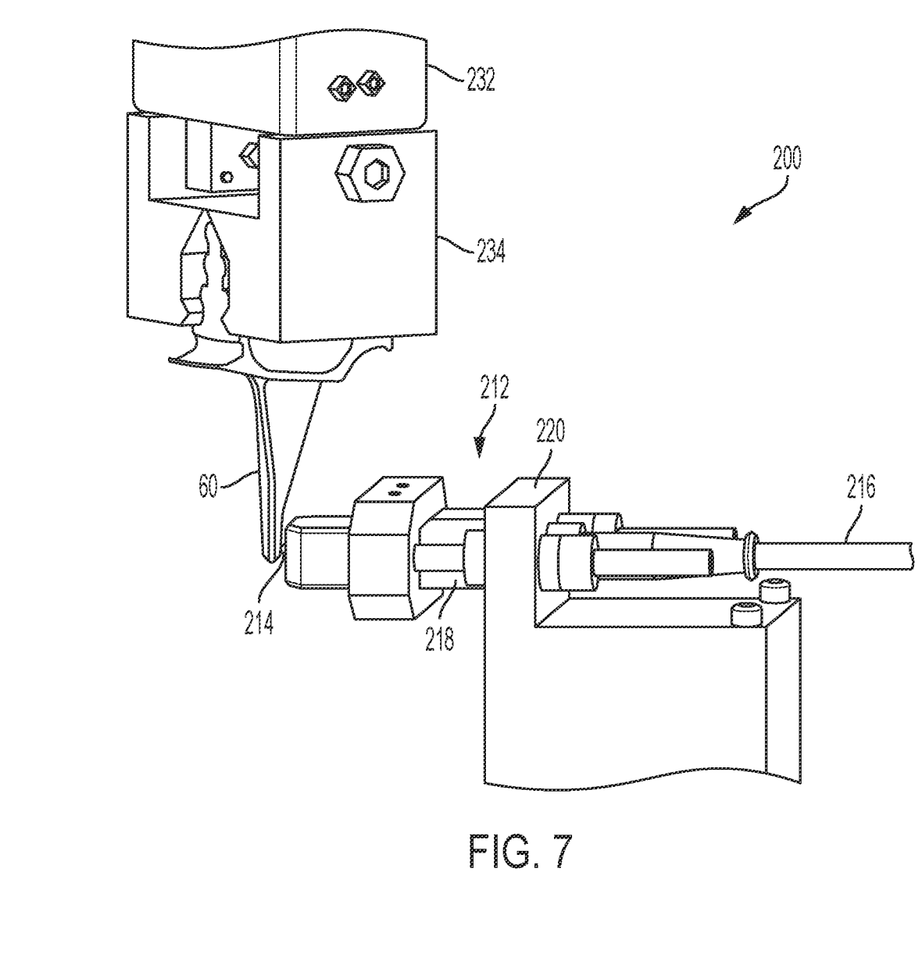
FIG. 7 is a perspective side view showing a portion of the automated magnetic inspection system shown in FIG. 6 and the turbine blade shown in FIG. 2A.

FIG. 7 is a perspective side view showing automated magnetic inspection system 200 shown as a block diagram in FIG. 6 along with turbine blade 60. Shown in FIG. 7 are turbine blade 60, automated magnetic inspection system 200, magnetic inspection probe 212, probe tip 214, probe cable 216, force transducer 218, probe fixture 220, actuator 232, and holder 234. Turbine blade 60, automated magnetic inspection system 200, magnetic inspection probe 212, probe tip 214, probe cable 216, and force transducer 218 all have descriptions as provided above in regard to FIG. 6. Actuator 232 supports holder 234, which in turn holds turbine blade 60 in a manner similar to that described above in regard to FIG. 5. Magnetic inspection probe 212 is held in place by probe fixture 220 which is supported by a platform (not shown in FIG. 7). Force transducer 218 detects the lateral force applied to probe tip 214 against probe fixture 220. An exemplary force transducer is a piezoelectric cell which develops a signal representative of the applied force. A person skilled in the sensor art is familiar with various means of sensing an applied force. Controller 250 receives the force signal generated by force transducer 218 to adjust the position of manipulator 230 in order to maintain a desired contact force between probe tip 214 and the surface of turbine blade 60. By using a closed-loop feedback control system that includes force transducer 218, positional errors can be compensated for, thereby assisting automated magnetic inspection system 200 in maintaining the desired contact force, thereby contributing to the accuracy of the corrosion inspection being performed by automated magnetic inspection system 200. Exemplary sources of positional errors include the ability of manipulator 230 to maintain a desired position and deviations between actual surface profile of turbine blade 60 and the digital surface profile that is modeled in CAD model 264. Preferably, light contact should be maintained between probe tip 214 and the exterior surface of turbine blade 60. An exemplary contact force is about 0.5 lbf (2.2 Nt), and a preferred (i.e., target) contact force can range from about 0-1 lbf (0-4.4 Nt).

Automated magnetic inspection system 200 is superior to a human operator in the ability to maintain a constant light contact force because of the solidness of electromechanical devices as opposed to a human hand and arm. Accordingly, automated magnetic inspection system 200 can maintain a target contact force with a high accuracy. In an exemplary embodiment, automated magnetic inspection system 200 can maintain a target contact force of 0.2 lbf (0.89 Nt) within a tolerance of ±20%. In some embodiments, automated magnetic inspection system 200 can maintain a target contact force that is zero or near-zero. Accordingly, in some embodiments automated magnetic inspection system 200 can be used to inspect components having delicate surfaces that would otherwise be susceptible to damage when using handheld magnetic probe 92 of the prior art.

Figure 8:
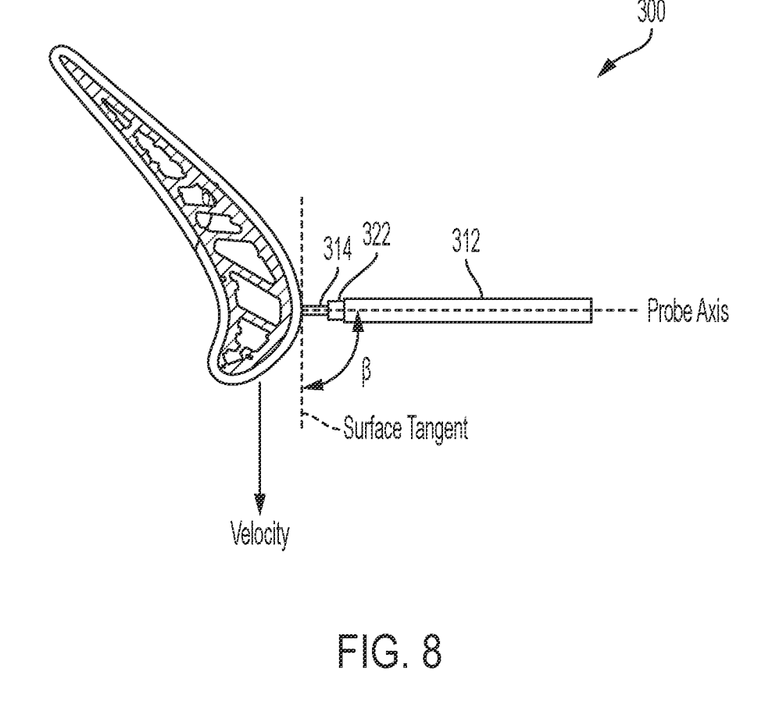
FIG. 8 is a cross-sectional side view showing a third embodiment of an automated magnetic inspection system and the turbine blade shown in FIG. 2B.

FIG. 8 is a cross-sectional side view showing a third embodiment of an automated magnetic inspection system and turbine blade 60. Shown in FIG. 8 are turbine blade 60, automated magnetic inspection system 300, magnetic inspection probe 312, probe tip 314, and probe effector 322. Also labeled in FIG. 8 is the probe axis, the surface tangent line at the point of contact between probe tip 314 and the surface of turbine blade 60, probe angle β, and a velocity vector. Turbine blade 60, magnetic inspection probe 312, and probe tip 314 all have descriptions as provided above in regard to FIG. 6. Probe tip 314 is supported by probe effector 322 which includes two features. Probe effector 322 includes a force transducer (not labeled) that provides an electrical signal representative of the contact force on probe tip 314 in a manner similar to that described above in regard to force transducer 218 shown in FIG. 7. Probe effector 322 also includes a mechanical biasing component (i.e., mechanically compressible component) that compresses in response to an increase in applied force, thereby mitigating the increase in applied force. A mechanical spring is an exemplary compressive biasing component. Accordingly, automated magnetic inspection system 300 having probe effector 322 can help automated magnetic inspection system 300 maintain a highly stable contact force by providing mechanical biasing (i.e., mechanically compressible biasing) in addition to the closed-loop feedback control system as described above in regard to FIG. 7. In an embodiment, probe effector 322 can include only a mechanical biasing device (e.g., spring), while omitting a force transducer. In this embodiment, probe effector 322 helps maintain the contact force within a desired range while omitting the closed loop feedback that is provided by the force transducer.

Referring again to FIG. 8, the probe axis forms probe angle β with the surface tangent at the point of contact between probe tip 314 and the surface of turbine blade 60. Automated magnetic inspection system 300 controls the position of turbine blade 60 such that probe angle β is 90 degrees. FIG. 8 depicts magnetic inspection probe 312 and turbine blade 60 in two dimensions for ease of illustration. In a practical embodiment, turbine blade 60 can have a three-dimensional surface curvature. Accordingly, the probe axis intersects with a surface tangent plane, and probe angle β can be measured with respect to an unlimited number of surface tangent vectors. Using a conventional Cartesian coordinate system, x- and y-orthogonal axes (not shown) can be defined at the point of contact, with probe angle β being resolved in each of the x- and y-axes (i.e., thereby providing component probe angles $\beta_x$ and $\beta_y$). Accordingly, in a practical embodiment, automated magnetic inspection system 300 controls the position of turbine blade 60 such that component probe angles $\beta_x$ and $\beta_y$ are each 90 degrees. In the illustrated embodiment, automated magnetic inspection system 300 maintains probe angle β (i.e., component probe angles $\beta_x$ and $\beta_y$) within 5 degrees of perpendicular (i.e., 90±5 degrees). In some embodiments, automated magnetic inspection system 300 can maintain probe angle β within 10 degrees of perpendicular. In other embodiments, automated magnetic inspection system 300 can maintain probe angle β within 1 degree of perpendicular. In yet other embodiments, automated magnetic inspection system 300 can maintain probe angle β within less than 1 degree of perpendicular. Controlling the probe angle β within specified limits can be referred to as the probe axis angle tolerance, or as a predetermined angle delta.

Automated magnetic inspection system 300 continuously adjusts and controls the position of turbine blade 60 such that the surface of turbine blade 60 moves at a steady speed (i.e., velocity) along probe tip 314. The accuracy of automated magnetic inspection system 300 (i.e., magnetic inspection probe 312) is improved by maintaining a steady relative speed (i.e., velocity) between probe tip 314 and turbine blade 60. The relative speed can be referred to as a scanning speed and can be programmed to be a desired target speed. In the illustrated embodiment, magnetic inspection probe 312 is fixed in place and turbine blade 60 is manipulated by the manipulator (not shown in FIG. 8) of automated magnetic inspection system 300. In other embodiments, turbine blade 60 fixed in place and magnetic inspection probe 312 can be manipulated by the manipulator.

In an exemplary embodiment, automated magnetic inspection system 300 can be programmed to a desired target speed of 0.5 inch/second (1.3 cm/sec.) while maintaining the scan speed within ±5% of the target speed. In some embodiments, the desired target speed of can range from 0.2-2 inch/second (0.5-5.1 cm/sec.) In other embodiments, the desired target speed of can be less than 0.2 inch/second (0.5 cm/sec.) or greater than 2 inch/second (5.1 cm/sec.) In any of these foregoing embodiments, automated magnetic inspection system 300 can maintain the scan speed within a tolerance other than +5% of the target speed. Exemplary tolerance values include ±20%, ±10%, ±2%, and ±1%.

Whereas a human operator can have difficulty controlling a hand-held probe of the prior art while maintaining a scan speed of greater than about 1 inch/second (2.5 cm/sec.), automated magnetic inspection system 300 can control the relative motion between probe tip 314 and turbine blade 60 at practically any scan speed. For example, in an exemplary embodiment, automated magnetic inspection system 300 can be programmed to a desired target speed that is greater than 10 inches/second (25 cm/sec.), with the upper limit on scan speed being established by the ability of magnetic inspection probe 312 (e.g., MAGNETOSCOP™) to resolve magnetic anomalies at a particular speed. Moreover, automated magnetic inspection system 300 can be programmed to utilize adaptive scan speed depending on the underlying structure of turbine blade 60. For example, automated magnetic inspection system 300 can be programmed to use a lower scan speed (i.e., a first scan speed) when in a region of turbine blade 60 where the underlying structure is complicated. Examples of complicated underlying structures are a wall thickness gradient and near the vicinity of internal ribs or other discontinuities. Automated magnetic inspection system 300 can be programmed to use a higher scan speed (i.e., a second scan speed) when in a region of turbine blade 60 where the underlying structure is uncomplicated. An example of an uncomplicated underlying structure is a uniform wall thickness that is not near an internal discontinuity. Automated magnetic inspection system 300 can set a particular scan speed based on the CAD model of turbine blade 60 that is stored within the controller. In an embodiment, three or more scan speeds can be established by automated magnetic inspection system 300. In another embodiment, the scan speed can be continuously variable.

Figure 9:
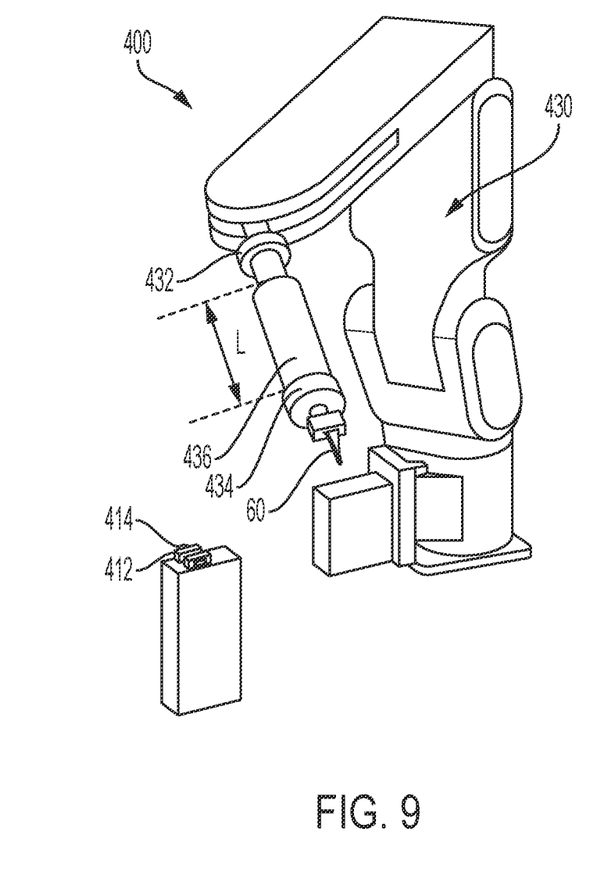
FIG. 9 is a perspective view showing a fourth embodiment of an automated magnetic inspection system and the turbine blade shown in FIG. 2B.

FIG. 9 is a perspective view showing a fourth embodiment of an automated magnetic inspection system and turbine blade 60. Shown in FIG. 9 are automated magnetic inspection system 400, magnetic inspection probe 412, probe tip 414, manipulator 430, actuator 432, holder 434, and holder extension 436. Also labeled in FIG. 9 is holder extension length L. The descriptions of magnetic inspection probe 412, probe tip 414, manipulator 430, and actuator 432 are substantially similar to those provided above in regard to FIG. 5. In some embodiments, magnetic inspection probe 412 can include a force transducer and/or a mechanical biasing component as described above in regard to FIGS. 7-8. Actuator 432 includes several electromechanical devices (i.e., motors) that can produce stray magnetic fields in their vicinity, as described above in regard to FIG. 5. These stray magnetic fiends can interfere with the signal being produced by magnetic inspection probe 412 (e.g., MAGNETOSCOP™), particularly when probe tip 414 is on a region of turbine blade 60 that is near actuator 432. Automated magnetic inspection system 400 shown in FIG. 9 physically separates turbine blade 60 from actuator 432 by using holder extension 436. In the illustrated embodiment, holder extension 436 is made of a nonmagnetic polymer material, with Nylon being an exemplary material. In other embodiments, holder extension 436 can be made of plastic, resin, and the like. Holder extension 436 can be referred to as a nonmagnetic holder extension. In the illustrated embodiment, holder extension length L is about 8 inches (20 cm). In some embodiments, holder extension length L can range from about 4-12 inches (10-30 cm). In other embodiments, holder extension length L can be less than about 4 inches (10 cm) or greater than about 12 inches (30 cm). In an embodiment, holder extension length L can be selected to provide a standoff distance (not labeled) from magnetic inspection probe 412 that eliminates or reduces magnetic interference caused by actuator 432 to a tolerable level. The standoff distance can be referred to as a critical separation distance, referring to the separation between actuator 432 and either turbine blade 60 or magnetic inspection probe 412 that reduces the effect of stray magnetic fields from actuator 432 to a tolerable level. While stray magnetic fields produced by actuator 432 can affect the operation of magnetic inspection probe 412, these stray magnetic fields can also affect the magnetic flux density within turbine blade 60, which can affect the accuracy of the corrosion inspection.

Discussion of Possible Embodiments

The following are non-exclusive descriptions of possible embodiments of the present invention.

A system for magnetically inspecting a metallic component having a surface, the system comprising: a part fixture configured to hold the metallic component in a first position; a probe fixture configured to hold a magnetic probe in a second position, the magnetic probe having a probe tip aligned with a probe axis and configured to measure a magnetic permeability of the metallic component; a manipulator configured to manipulate a relative position between the first position and the second position; and a controller configured to: cause the manipulator to manipulate the relative position so as to cause the probe tip to trace an inspection route upon the surface of the metallic component along which the probe tip contacts the metallic component such that an angular difference between the probe axis and a vector normal to the surface is less than a predetermined angle delta; and receive the magnetic permeability of the metallic component measured by the magnetic probe along the inspection route.

The system of the preceding paragraph can optionally include, additionally and/or alternatively, any one or more of the following features, configurations and/or additional components:

A further embodiment of the foregoing system, wherein the controller is further configured to calculate, based on a three-dimensional model of the metallic component, the inspection route.

A further embodiment of the foregoing system, wherein the magnetic inspection probe is a MAGNETOSCOP™.

A further embodiment of the foregoing system, wherein the controller is further configured to generate, based on the magnetic permeability measured along the inspection route, a magnetic anomaly map and/or a corrosion map of the magnetic component.

A further embodiment of the foregoing system, wherein: tracing the inspection route defines a linear speed; and the linear speed is within a target speed tolerance of a target speed.

A further embodiment of the foregoing system, wherein the target speed ranges from 0.2-10 inches/second (0.5-25 cm/sec).

A further embodiment of the foregoing system, wherein the target speed tolerance is +5% of the target speed.

A further embodiment of the foregoing system, further comprising a mechanical biasing component, wherein: the probe tip contacting the metallic component defines a contact force; and the mechanical biasing component is configured to maintain the contact force within a contact force tolerance of a target contact force.

A further embodiment of the foregoing system, wherein the mechanical biasing component comprises a mechanically compressible component.

A further embodiment of the foregoing system, further comprising a force transducer, wherein: the probe tip contacting the metallic component defines a contact force; and the force transducer is configured to produce a contact force signal that is indicative of the contact force.

A further embodiment of the foregoing system, wherein the controller is further configured to cause the manipulator to maintain the contact force within a contact force tolerance of a target contact force.

A further embodiment of the foregoing system, the target contact force ranges from 0-1 pounds force (lbf) (0-4.4 Nt).

A further embodiment of the foregoing system, wherein the contact force tolerance is +20% of the target contact force.

A further embodiment of the foregoing system, wherein: the manipulator is manipulatable with three, four, five, or six axes of movement; and the manipulator comprises an actuator configured to manipulate a holder that is configured to hold the metallic component.

A further embodiment of the foregoing system, further comprising a holder extension configured to separate the metallic component from the actuator by at least a critical separation distance.

A further embodiment of the foregoing system, wherein: the holder extension comprises a nonmetallic material defining a length; and the length is at least 4 inches (10 cm).

A further embodiment of the foregoing system, wherein the predetermined angle delta is +5 degrees.

A further embodiment of the foregoing system, wherein: the second position is stationary; and the manipulator is further configured to manipulate the metallic component.

A further embodiment of the foregoing system, wherein the metallic component is a component that can be included in a gas turbine engine.

A method of using a system to inspect a metallic component having a surface, the system comprising a part fixture configured to hold the metallic component in a first position, a probe fixture configured to hold a magnetic probe having a probe tip aligned with a probe axis and configured to measure a magnetic permeability of the metallic component in a second position, a manipulator configured to manipulate a relative position between the first position and the second position, and a controller, the method comprising: calculating, by the controller, an inspection route over at least a portion of the surface based at least in part on a three-dimensional model of the metallic component; generating, by the controller, a control signal that causes the manipulator to: manipulate the relative position so as to cause the probe tip to trace an inspection route upon the surface of the metallic component along which the probe tip contacts the metallic component such that an angular difference between the probe axis and a vector normal to the surface is less than a predetermined angle delta; and receiving, by the controller, the magnetic permeability of the metallic component measured by the magnetic probe along the inspection route.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for magnetically inspecting a metallic component having a surface, the system comprising:
   a holder configured to hold the metallic component
   a probe fixture configured to hold a magnetic probe having a probe tip aligned with a probe axis, the magnetic probe configured to measure a magnetic permeability of the metallic component;
   a manipulator configured to manipulate a relative position between the holder and the probe fixture to put the probe tip in contact with the metallic component;
   a controller configured to:
      control the manipulator to trace an inspection route upon the surface of the metallic component along which the probe tip contacts the metallic component such that an angular difference between the probe axis and a surface tangent plane of the metallic component is 90±10 degrees; and
      receive the magnetic permeability of the metallic component measured by the magnetic probe along the inspection route;
   a mechanical biasing component, wherein the mechanical biasing component comprises a mechanically compressible component that is configured to maintain contact between the probe tip and the metallic component; and
   a force transducer configured to produce a contact force signal that is indicative of a contact force between the probe tip and the metallic component.

2. The system of claim 1, wherein the controller is further configured to calculate, based on a three-dimensional model of the metallic component, the inspection route.

3. The system of claim 1, wherein the controller is further configured to:
   determine a magnetic anomaly map based on the magnetic permeability of the metallic component;
   determine a first corrosion element thickness based on the magnetic anomaly map;
   determine a first remaining non-corrosion wall thickness based on a calculation using the first corrosion element thickness and a three-dimensional model of the metallic component; and
   transmit the first remaining non-corrosion wall thickness to an operator via an input output interface.

4. The system of claim 1, wherein the controller is further configured to generate, based on the magnetic permeability measured along the inspection route, a magnetic anomaly map and/or a corrosion map of the magnetic component.

5. The system of claim 1, wherein:
   tracing the inspection route defines a linear speed; and
   the linear speed is within a target speed tolerance of a target speed.

6. The system of claim 5, wherein the target speed ranges from 0.2-10 inches/second (0.5-25 cm/sec).

7. The system of claim 6, wherein the target speed tolerance is ±5% of the target speed.

8. The system of claim 1, wherein the controller is further configured to cause the manipulator to maintain the contact force within a contact force tolerance.

9. The system of claim 8, wherein the contact force tolerance ranges from 0-1 pounds force (lbf) (0-4.4 Nt).

10. The system of claim 9, wherein the contact force tolerance is ±20% of a target contact force of 0.2 lbf (0.89 Nt).

11. The system of claim 1, wherein:
   the manipulator is manipulatable with three, four, five, or six axes of movement; and
   the manipulator comprises an actuator configured to manipulate the holder.

12. The system of claim 11, further comprising a holder extension configured to separate the metallic component from the actuator by at least a critical separation distance.

13. The system of claim 12, wherein:
   the holder extension comprises a nonmetallic material defining a length; and
   the length is at least 4 inches (10 cm).

14. The system of claim 1, wherein the controller is further configured to:
   determine a magnetic anomaly map based on the magnetic permeability of the metallic component;
   determine a corrosion map based on the magnetic anomaly map;
   determine a material remaining map based on a comparison of the corrosion map and a three-dimensional model of the metallic component; and
   transmit the material remaining map to an operator via an input output interface.

15. The system of claim 1, wherein the magnetic probe is stationary.

16. The system of claim 1, wherein the metallic component is a blade of a gas turbine engine.

17. A system for magnetically inspecting a metallic component having a surface, the system comprising:
   a holder configured to hold the metallic component
   a probe fixture configured to hold a magnetic probe having a probe tip aligned with a probe axis, the magnetic probe configured to measure a magnetic permeability of the metallic component;
   a manipulator configured to manipulate a relative position between the holder and the probe fixture;
   a controller configured to:
      control the manipulator to trace an inspection route upon the surface of the metallic component along which the probe tip contacts the metallic component such that an angular difference between the probe axis and a surface tangent plane of the metallic component is 90±10 degrees; and receive the magnetic permeability of the metallic component measured by the magnetic probe along the inspection route; and a force transducer, wherein the force transducer comprises a piezoelectric cell that is configured to produce a contact force signal that is indicative of a contact force between the probe tip and the metallic component.

18. The system of claim 17, further comprising:

a mechanical biasing component, wherein the mechanical biasing component comprises a spring that is configured to maintain the contact force within a desired contact force tolerance.

* * * * *